United States Patent [19]
Takamori

[11] Patent Number: 6,008,542
[45] Date of Patent: Dec. 28, 1999

[54] SEMICONDUCTOR DEVICE HAVING LONG PADS AND SHORT PADS ALTERNATED FOR FINE PITCH WITHOUT SACRIFICE OF PROBING

[75] Inventor: Kazuo Takamori, Kanagawa, Japan

[73] Assignee: NEC Corporation, Tokyo, Japan

[21] Appl. No.: 09/140,656

[22] Filed: Aug. 26, 1998

[30] Foreign Application Priority Data

Aug. 27, 1997 [JP] Japan .................................. 9-231523

[51] Int. Cl.⁶ .................................................. H01L 23/48
[52] U.S. Cl. .......................... 257/773; 257/779; 257/780; 257/781; 257/784; 257/786
[58] Field of Search ..................... 257/773, 780, 257/781, 779, 784, 786, 48, 680, 690; 29/827

[56] References Cited

U.S. PATENT DOCUMENTS 4,763,409  8/1988  Takekawa et al. ...................... 257/672

FOREIGN PATENT DOCUMENTS

| 488186-A1 | 6/1992 | European Pat. Off. ............... 257/784 |
| 1-319956 | 12/1989 | Japan . |
| 2-166744 | 6/1990 | Japan . |
| 6-252201 | 9/1994 | Japan . |
| 7-106384 | 4/1995 | Japan . |
| 9-129809 | 5/1997 | Japan . |
| 2 244 864 | 11/1991 | United Kingdom . |

OTHER PUBLICATIONS

Anderson et al., Extended Pad for Testing Package Parts, IBM Technical Disclosure Bulletin, vol. 27, No. 7B, Dec. 1984.

Primary Examiner—Tom Thomas
Assistant Examiner—Thien F Tran
Attorney, Agent, or Firm—Sughrue, Mion, Zinn, Macpeak & Seas, PLLC

[57] ABSTRACT

An integrated circuit fabricated on a semiconductor chip is electrically connected through an array of pads to leads of a package; the pad array includes long pads exposed to first partially constricted openings and short pads exposed to second partially constricted openings and alternated with the long pads, and the wide portions of the first partially constricted openings are offset from the wide portions of the adjacent second partially constricted openings so that the manufacturer arranges the long pads and the short pads at a fine pitch less than 40 microns.

16 Claims, 18 Drawing Sheets

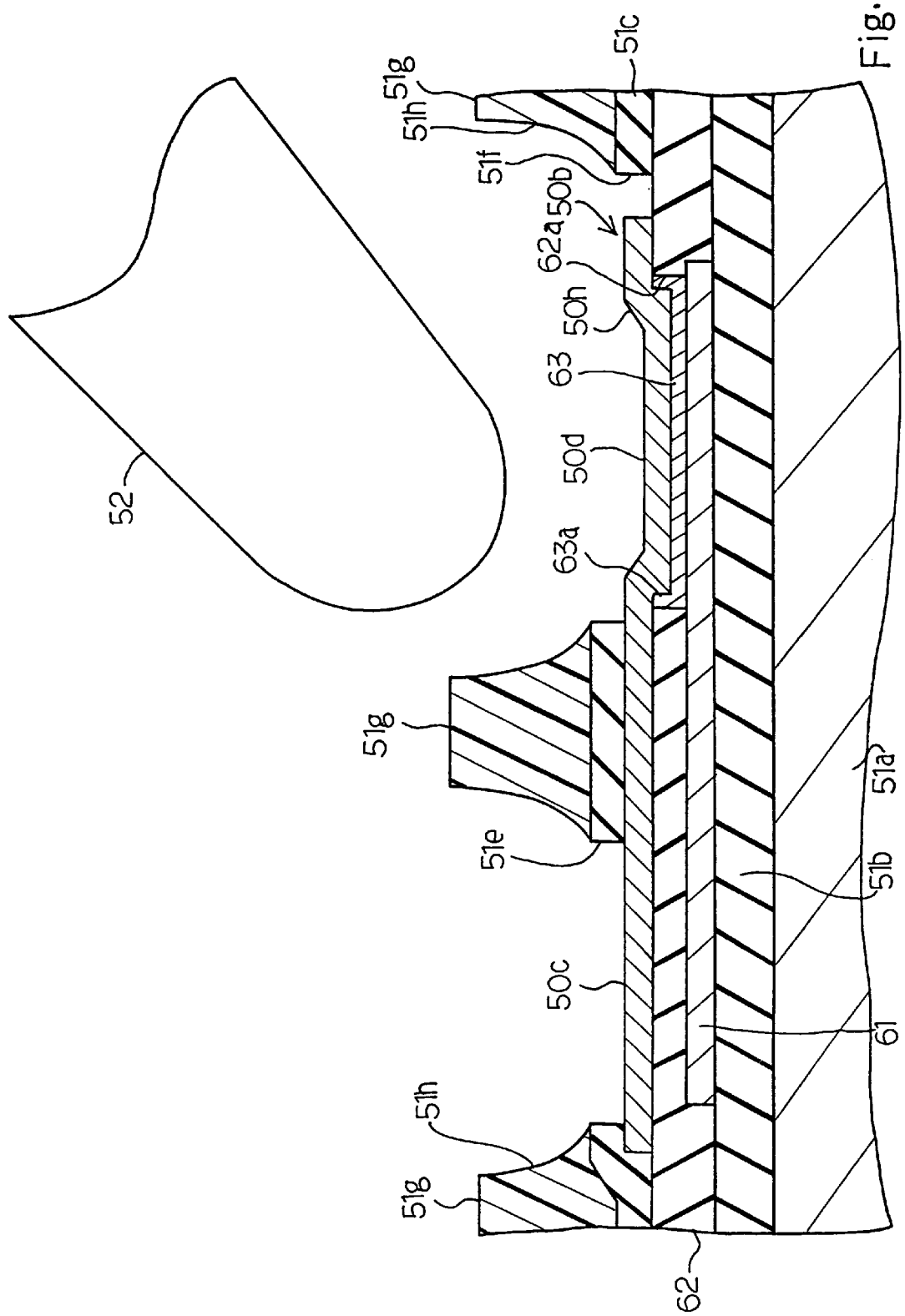

SEMICONDUCTOR DEVICE HAVING LONG PADS AND SHORT PADS ALTERNATED FOR FINE PITCH WITHOUT SACRIFICE OF PROBING

FIELD OF THE INVENTION

This invention relates to a semiconductor device and, more particularly, to a semiconductor device having pads arranged at fine pitch without sacrifice of probing during a diagnosis.

DESCRIPTION OF THE RELATED ART

Firstly, three kinds of prior art arrangement of pads are hereinbelow described. Referring to FIGS. 1 and 2 of the drawings, pads 1 are formed on an insulating layer 2, and the insulating layer 2 is formed on a semiconductor substrate 3. The pads 1 are exposed to rectangular openings 4 formed in a passivation layer 5, and the passivation layer 5 is covered with a polyimide cover layer 6. Openings are also formed in the polyimide cover layer 6, and are aligned with the rectangular openings 4 of the passivation layer 5. For this reason, the pads 1 are seen over the polyimide cover layer 6. The laminated structure shown in FIG. 2 is called as a semiconductor chip.

An aluminum plate 1a forms essential part of the pad 1, and the pads 1 are connected through conductive strips 7 to an integrated circuit fabricated on the semiconductor substrate 3. The pads 1 are formed in the periphery of the semiconductor chip, and form a single line along each edge line of the semiconductor chip. The pads 1 are spaced from one another, and the pitch D1 of pads 1 is, by way of example, 100 microns.

The integrated circuit has been improved to be multifunctional. An advanced semiconductor integrated circuit device has more than 1000 pads in the peripheral area. If the semiconductor integrated circuit device is fabricated on a semiconductor chip measuring 10 millimeters by 10 millimeters, the manufacturer is required to make 250 pads in a line along each edge line. The 250 pads 1 along the edge of 10 millimeters make the pitch D1 40 microns. Thus, increase of pads 1 results in decrease of the pitch D1. However, there is a limit on the pitch D1. If the pitch D1 is decreased to 80 microns, the manufacturer feels the tests carried out after completion of the product difficult. A testing system presses a probe card to the pads 1, and supplies a test pattern to see whether the integrated circuit is defective or not. The probe card has a large number of probes, and the probes are of the order of 70 microns thick. When the probes are made thin, they are liable to be bent and broken. For this reason, the minimum pitch is of the order of 80 microns.

In order to increase the pads, it is proposed to arrange pads 11 in a staggered manner as shown in FIG. 3. Aluminum plates 11a form the pads 11, and conductive strips 12 are connected to the aluminum plates 11a, respectively. The probes are moved in the direction indicated by arrow AR1. The aluminum plates 11a are respectively exposed to rectangular openings 13 formed in a protective layer 14. The staggered pads 11a make two rows 15a/15b, and the pads 11a in each row 15a/15b are arranged at pitch D2. Even though the pitch D2 is 120 microns, the two rows of pads at 120 micron pitch are equivalent to a single row of pads at 60 micron pitch. For this reason, the tester can check the semiconductor integrated circuit device by means of the probe card.

Thus, the staggered pads 11 increase the pitch D2, and the manufacturer checks the semiconductor integrated circuit device with the probe card. However, when the pitch D2 is decreased to 80–60 microns, the manufacturer encounters a difficulty in wire bonding. The pads 11 are partially used for the testing and partially connected to leads of a package through bonding wires. The bonding wires are pressed against the aluminum plates 11a, and connect the integrated circuit to leads of a package. When the pads 11 decrease the pitch D2, the bonding wires are liable to be short-circuited, broken and pealed from the pads 11. For this reason, when the semiconductor integrated circuit device requires pads 11 at 80–60 micron pitch, the integrated circuit is connected to inner leads by using a tape automated bonding technology.

The inner leads are formed from a thin conductive layer covering an insulating tape by using an etching. If the pads are arranged in single row, the inner leads are simply repeated, and the etching conditions are easily optimized. However, when the pads 11 are staggered, the inner leads form a complicated pattern, and the etching conditions are hardly optimized. For this reason, when a semiconductor integrated circuit device requires the pad pitch equal to or less than 60 microns, the staggered pads 11 are used for assemblage with a package, and the single row of pads 1 are prepared for the probe card. Thus, the pads are arranged in single row or stagger.

FIG. 4 illustrates another prior art pad arrangement. The prior art pad arrangement is a compromise of the prior art arrangements shown in FIGS. 1 and 3. The pads 31 are arranged at pitch D3 in the direction perpendicular to the moving direction AR2 of a probe card. Aluminum plates 31a are connected to conductive strips 32, respectively, and are exposed to rectangular openings 33a formed in a protective layer 33. In this instance, the rectangular openings 33a are narrower than the aluminum plates 31a. The aluminum plates 31a are elongated in the direction AR2. Probes are brought into contact with areas 31b, and inner leads are bonded to areas 31c. The areas 31b are staggered, and the area 31c makes a row in the direction perpendicular to arrow AR2. Although the prior art pad arrangement is not popular, the prior art arrangement allows the manufacturer to arrange the probes in a staggered manner and the inner leads simple. The compromised pad arrangement allows the manufacturer to decrease the pad pitch less than 80 microns. However, it is hard to realize the pad pitch equal to or less than 40 microns. This is because of the fact that the rectangular openings 33a are inside the periphery of the aluminum plates 31a. When the pad pitch is decreased together with the width of the aluminum plates 31a, the width of the rectangular openings 33a becomes less than 40 microns, and the probes are not always brought into contact with the aluminum plates 31a.

Subsequently, description is made on the prior art pad structures. The first prior art pad structures is disclosed in Japanese Patent Publication of Unexamined Application No. 2-166744, and FIGS. 5 and 6 illustrate the first prior art pad structure. A semiconductor substrate 21 is covered with an insulating layer 22, and an aluminum plate 23 and a conductive strip 24 are formed on the insulating layer 22. The insulating layer 22 is covered with a passivation layer 25, and a rectangular opening 25a is formed in the passivation layer 25. The rectangular opening 25a is wider than the aluminum plate 23, and the aluminum plate 23 and a part of the conductive strip 24 are exposed to the rectangular opening 25a. The passivation layer 25 is covered with a polyimide layer 26, and an opening 26a is formed in the polyimide layer 26 in such a manner as to be registered with the opening 25a. The wide openings 25a prevent the passivation layer 25 from cracks due to the collision between a probe and the passivation layer 25. Thus, the rectangular opening 25a wider than the aluminum pad 23 aims at protection of the passivation layer 25 against the probe, and the alignment between the probe and the aluminum pad 23 is never considered.

Another pad structure is disclosed in Japanese Patent Publication of Unexamined Application No. 6-252201, and FIGS. 7 and 8 illustrate the prior art pad. A semiconductor substrate 41 is covered with an insulating layer 42, and a lower aluminum strip 43 is patterned on the insulating layer 42. The lower aluminum strip 43 is exposed to a contact hole 44a formed in an insulating layer 44, and an upper aluminum plate 45 is patterned on the insulating layer 44. The upper aluminum plate 45 passes through the contact hole 44a, and is held in contact with the lower aluminum strip 43. The lower aluminum strip is narrower than the upper aluminum pad 45, and pushes up a part of the upper aluminum plate 45. As a result, the upper aluminum plate 45 is bent, and a step is formed in the upper aluminum plate 45. An oblique surface 45a of the step increases a contact area between the upper aluminum plate 45 and a bonding wire or a bump. The upper aluminum plate 45 is exposed to a rectangular opening 46a of a passivation layer 46, and the rectangular opening 46a is registry with an opening 47a of a polyimide layer 47. Thus, the prior art structure aims at increase of the contact area between the bonding wire/bump and the upper aluminum pad 45. The inner surface of the polyimide layer 47 is rounded, and a probe would be guided by the rounded inner surface so as to be brought into contact with the upper aluminum pad 45.

The advantages of the step are lost in an ultra large scale integration, because the inter-level insulating layers are chemically mechanically polished before deposition of conductive material. In other words, the flat insulating layer 44 does not form the step 45a in the aluminum pad 45, and the contact area is not increased. FIGS. 9 and 10 illustrate the semiconductor ultra large scale integrated circuit device. The inter-level insulating layer 44b is chemically mechanically polished before deposition of aluminum, and the lower aluminum strip 43 is connected through conductive plugs 48 to the upper aluminum plate 45. The conductive plugs 48 measure 0.5 micron by 0.5 micron. The upper aluminum plate 45 is patterned on the flat surface of the inter-level insulating layer 44b created through the chemically mechanically polishing, and, any step is formed in the upper aluminum plate 45.

Finally, description is made on a prior art process for forming the pad 45 with reference to FIGS. 11A and 11B. First, the inter-level insulating layer 42 is deposited over the semiconductor substrate 41. Aluminum is deposited to 0.5 micron thick over the inter-level insulating layer 42 by using a sputtering, and a photo-resist etching mask (not shown) is formed on the aluminum layer through photo-lithographic techniques. Using the photo-resist etching mask, the aluminum player is selectively etched away, and is formed into the lower aluminum strip 43.

Subsequently, insulating material is deposited to 0.8 micron thick over the entire surface of the resultant structure, and the inter-level insulating layer 44 conformably extends over the inter-level insulating layer 42 and the lower aluminum strip 43. For this reason, inter-level insulating layer 43 is partially lifted by the lower aluminum strip 43. A photo-resist etching mask (not shown) is formed on the inter-level insulating layer 44, and the inter-level insulating layer 44 is partially etched away so as to form the contact hole 44a.

Aluminum is deposited over the entire surface of the resultant structure by using the sputtering. The aluminum fills the contact hole 44a, and swells into an aluminum layer of 0.7 micron thick. The aluminum layer conformably extends, and the oblique surface 45a forms the step. A photo-resist etching mask (not shown) is formed on the aluminum layer, and the aluminum layer is patterned into the upper aluminum plate 45 by using the etching. The resultant structure is shown in FIG. 11A.

Silicon nitride is deposited to 0.3 micron thick over the entire surface of the resultant structure, and the polyimide layer of 5 micron thick is laminated on the silicon nitride layer. The silicon nitride layer serves as the passivation layer 46, and the passivation layer 46 is overlain by the polyimide layer 47. A photo-resist etching mask (not shown) is formed on the polyimide layer 47, and the polyimide layer 47 is partially etched away in wet etchant so as to form the opening 47a. The wet etchant rounds the inner surface of the polyimide layer 47, and the passivation layer 46 is partially etched away so as to form the rectangular opening 46a as shown in FIG. 11B.

As described hereinbefore, three kinds of pad arrangement and three kinds of pad structure are known. The three kinds of pad arrangement are the single row, the stagger and the compromise therebetween, and the three kinds of pad structures are the wide flat pad exposed to the narrow opening, the narrow pad nested in the wide opening and the wide stepped pad exposed to the narrow opening.

Although the compromise is the most appropriate for the semiconductor ultra large scale integrated circuit device, the pad structure is categorized in the first structure, i.e., the wide flat pad exposed to the narrow opening, and the pad pitch is hardly decreased to 40 microns. In detail, because the opening is less than 40 microns wide, and the probe is not always brought into contact with the aluminum plate 31a. For this reason, the compromise is hardly used for a semiconductor ultra large scale integrated circuit device of the next generation. The other combinations between the compromise and the remaining two kinds of pad structure are not known.

SUMMARY OF THE INVENTION

It is therefore an important object of the present invention to provide a semiconductor device, pads of which are arranged at a pitch less than 40 microns without misalignment with a probe.

In accordance with one aspect of the present invention, there is provided a semiconductor device comprising a substrate structure having an insulating layer, a plurality of first pads formed on the insulating layer and electrically connected to an integrated circuit, a plurality of second pads longer than the plurality of first pads, electrically connected to the integrated circuit and alternated with the plurality of first pads on the insulating layer along a first virtual line, a protective layer covering the insulating layer, the plurality of first pads and the plurality of second pads and formed with a plurality of first openings respectively associated with the plurality of first pads and constricted from respective first wide portions to respective first narrow portions and a plurality of second openings respectively associated with the plurality of second pads and constricted from respective second wide portions to respective second narrow portions, and the second wide portions are offset front the first wide portions in longitudinal directions of the plurality of second pads perpendicular to the first virtual line.

BRIEF DESCRIPTION OF THE DRAWINGS

The features and advantages of the semiconductor device will be more clearly understood from the following description taken in conjunction with the accompanying drawings in which:

FIG. 19 is a cross sectional view taken along line J—J of FIG. 16 and showing the structure of the semiconductor device;

DESCRIPTION OF THE PREFERRED EMBODIMENTS

First Embodiment

Figure 1:
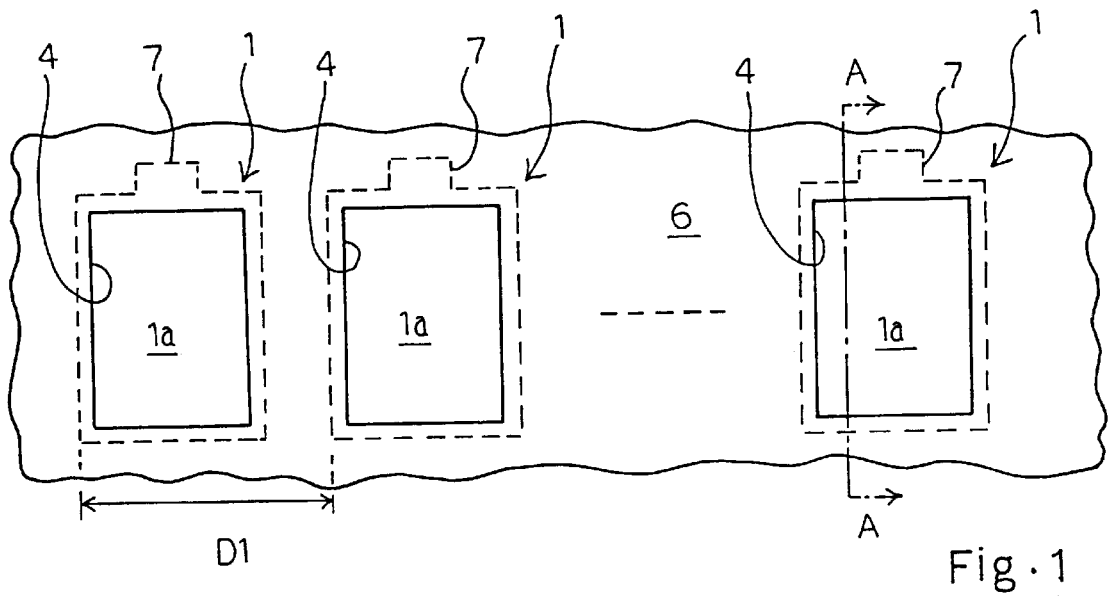
FIG. 1 is a plane view showing the arrangement of the pads incorporated in the prior art semiconductor device.
Figure 2:
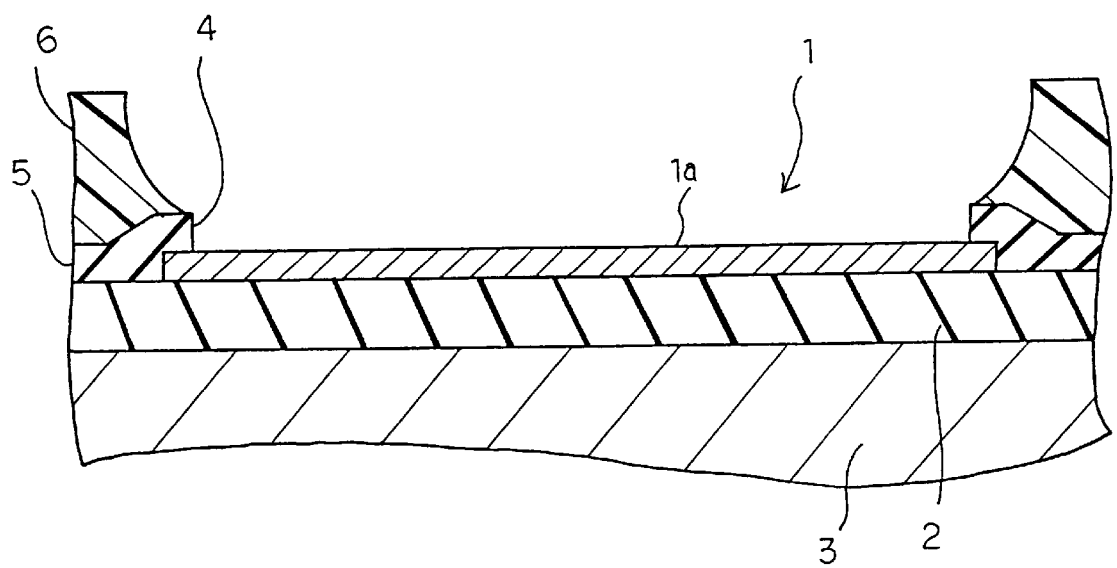
FIG. 2 is a cross sectional view taken along line A—A of FIG. 1 and showing the structure of the prior art semiconductor device.
Figure 3:
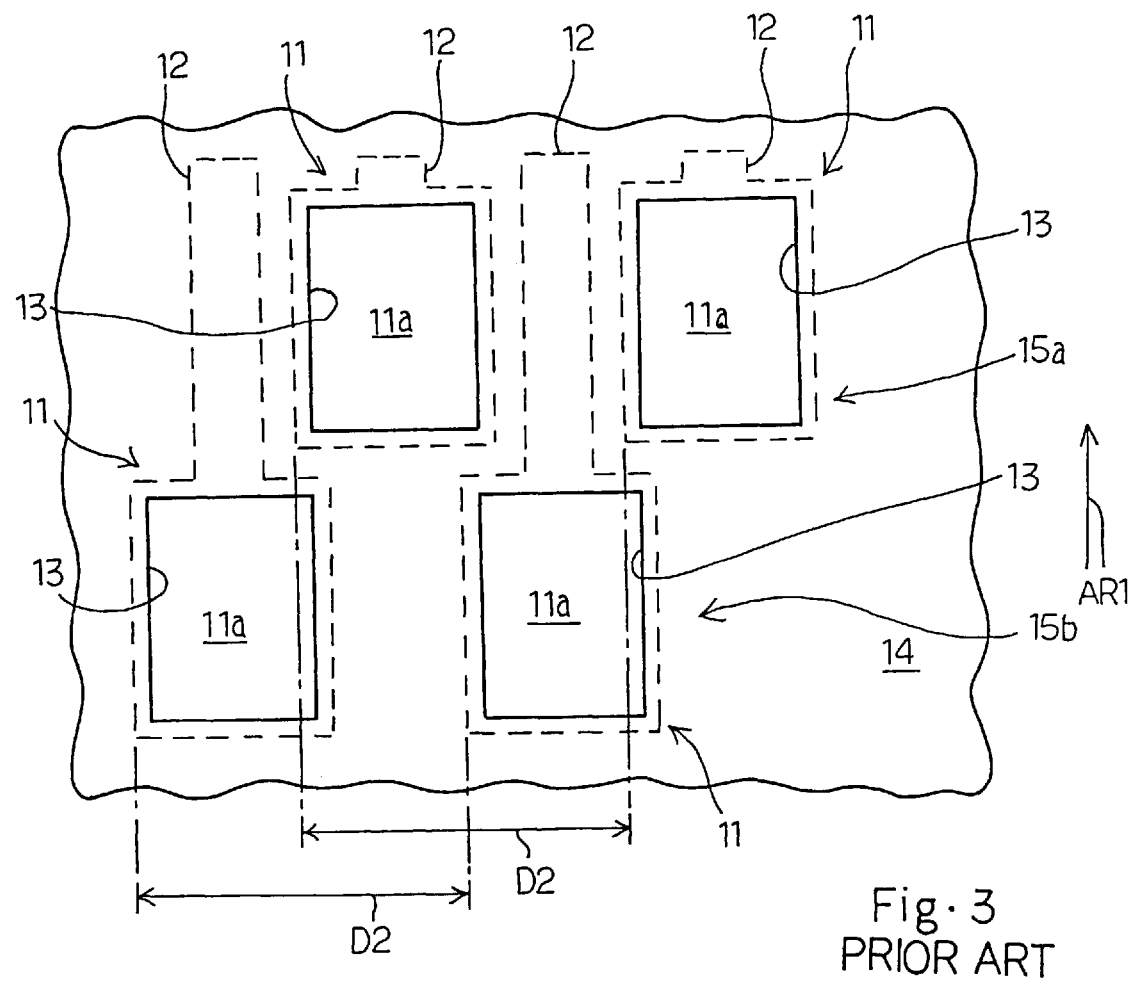
FIG. 3 is a plane view showing the staggered arrangement of pads incorporated in another prior art semiconductor device.

Referring to FIGS. 12 to 15 of the drawings, a semiconductor device embodying the present invention includes an array 50 of pads arranged along a periphery of a semiconductor chip 51, and long pads 50a and short pads 50b form the array 50. The semiconductor chip 51 includes a semiconductor substrate 51a, and a major surface of the semiconductor substrate 51a is selectively covered with an insulating layer 5 lb. Circuit components of an integrated circuit IC are fabricated on the major surface of the semiconductor substrate 51b. A passivation layer 51c is laminated on the insulating layer 51b, and openings 51d/51e/51f are formed in the passivation layer 51c. The passivation layer 51c is, by way of example, formed of silicon nitride. A polyimide layer 51g is further laminated on the passivation layer 51c, and openings 51h are also formed in the polyimide layer 51g. The openings 51h are registry with the openings 51d/51e/51f, and the long/short pads 50a/50b are exposed to the openings 51d–51f/51h as will be described in detail. The polyimide layer 51g has inner surfaces defining the openings 51h, and the inner surfaces are rounded so as to guide probes 52 to the long/short pads 50a/50b. The innermost periphery of the opening 51h is aligned with the periphery of the associated opening 51d, 51e or 51f, and the probes 52 slide on the long/short pads 50a/50b in a direction indicated by arrow AR10. The polyimide layer 51g is removed from the semiconductor chip 50 shown in FIG. 12 for better understanding of the openings 51d to 51f. In this instance, the insulating layer 51b is 1.5 microns thick, and is subjected to a chemical mechanical polishing. The long/short pads 50a/50b are 0.6 micron thick, and the passivation layer 51c and the polyimide layer 51g are 1 micron thick and 5 microns thick, respectively.

The long/short pads 50a/50b are formed of aluminum or aluminum alloy, and are connected through conductive strips 53 to the integrated circuit IC. The long pads 50a are alternated with the short pads 50b. In this instance, the short pads 50b are arranged at 60 microns in pitch d1, and the long pads 50a are also arranged at 60 microns in pitch d2. The long pad 50a is shaped into a rectangular configuration, and has a first contact portion 50c, a second contact portion 50d and a connecting portion 50e. The short pad 50b is also shaped into a rectangular configuration, and has a third contact portion 50f and a fourth contact portion 50g. In the following description, although only the openings 51d–51f are described in conjunction with the long/short pads 50a/50b, the openings 51h have similar configurations to the openings 51d to 51f, and cooperate with the associated openings 51d to 51f so as to achieve advantages of the present invention.

The first contact portion 50c is constant in width, and is exposed to the opening 51e also constant in width. The first contact portion 50c is wider than the opening 51e, and the periphery of the first contact portion 50c is retracted from the periphery of the opening 51e. The first contact portion 50c provides a first contact area, and an inner lead 54 or a bonding wire 54 is held in contact with the first contact area. The inner leads/bonding wires 54 form parts of a package. The second contact portion 50d is also constant in width, and is exposed to the opening 51f. The opening 51f is partially wide and partially narrow. The second contact portion 50d is narrower than the wide portion of the opening 51f, and is wider than the narrow portion of the opening 51f. For this reason, the periphery of the second contact portion 50d is exposed to the wide portion of the opening 51f, and is retracted from the periphery of the narrow portion of the opening 51f. The opening 51f is constricted between the narrow portion and the wide portion, and the second contact portion provides a second contact area mainly in the narrow portion. The probe 52 is guided along the constricted portion of the opening 51f during the sliding motion in the direction of allow AR10, and is exactly brought into contact with the second contact area. The connecting portion 50e is equal in width to the first and second contact portions 50c/50d, and extends under the passivation layer 51c as will be better seen in FIG. 15.

The third contact portion 50f is equal in width to the fourth contact portion 50g, and is contiguous to the fourth contact portion 50g without any connecting portion. The opening 51d is partially narrow and partially wide, and the short pad 50b is wider than the narrow portion of the opening 51d and is narrower than the wide portion of the opening 51d. For this reason, the periphery of the short pad 50b is retracted from the periphery of the narrow portion of the opening 51d, and is exposed to the wide portion of the opening 51d. The third contact portion 50f provides a third contact area, and the inner lead/bonding wire 54 is held in contact with the third contact area. The first contact area and the third contact area are aligned with a first virtual line VT1 perpendicular to the direction indicated by arrow AR10. The opening 51d is constricted between the narrow portion and the wide portion, and the constricted portion is associated with the fourth contact portion 50g. The fourth contact portion 50g is mainly in the narrow portion of the opening 51d, and the constricted portion guides the probe 52 so as to bring it into contact with a fourth contact area of the fourth contact portion 50g. The second and fourth contact areas are staggered with respect to a second virtual line VT2 parallel to the first virtual line VT1.

When the manufacturer tests the integrated circuit IC, a tester (not shown) lightly presses the probes 52 against the second/fourth contact portions 50d/50g, and easily inserts the probes 52 into the wide portions of the openings 51d/51f. In other words, even though the probes 52 are thick, the thick probes 52 are brought into contact with the second/fourth contact portions 50d/50g through the wide portions of the openings 51f/51d.

Subsequently, the tester moves the probes 52 in the direction indicated by arrow AR10, and increases the pressure against the second/fourth contact portions 50d/50g. The constricted portions guide the probes 52 to the second/fourth contact areas. Even if the probes 52 overrun the second/fourth contact areas, the passivation/polyimide layers 51c/51g over the conductive strip/connecting portion 53/50e stop the probes, and the probes 52 surely reach the second/fourth contact areas, respectively. As described hereinbefore, the polyimide layer 51g and the passivation layer 51c are 5 microns thick and 1 micron thick, respectively. The probe 52 has the contact portion of the order of tens microns thick. For this reason, the polyimide/passivation layers 51g/51c serve as the guide for the probes 52. Thus, all the probes 52 are exactly held in contact with the second/fourth contact areas, and test patterns are surely supplied through the probes 52 to the integrated circuit IC. With the test patterns, the tester checks the integrated circuit IC through the probes 52 to see whether or not a defective component is incorporated in the integrated circuit IC, and the diagnosis is reliable.

As described hereinbefore, the pitches d1 and d2 are 60 microns. The array 50 is equivalent to a single row of pads equal in pitch to 30 microns. Thus, the array 50 of pads achieves the fine pitch d3 of 30 microns, which is available for a semiconductor ultra large scale integrated circuit device of the next generation. Even though the array 50 of pads is arranged at the fine pitch d3, the openings 51d/51f allow the tester to bring the probes 52 into contact with the long/short pads 50a/50b easier than the prior art semiconductor device as described hereinbelow in detail.

Assuming now that the distance d4 between the long pad 50a and the short pad 50b, the distance d5 between the periphery of the pad 50a/50b and the periphery of the narrow portion of the opening 51d/51e/51f and the distance d6 between the periphery of the pad 50a/50b and the periphery of the wide portion are 3 microns, 3 microns and 2 microns, respectively, the width d7 of the wide portion of the opening 51d/51f is given as follows.

$$d7=d3-d4+2\times d6=31 \text{ microns}$$

Figure 4:
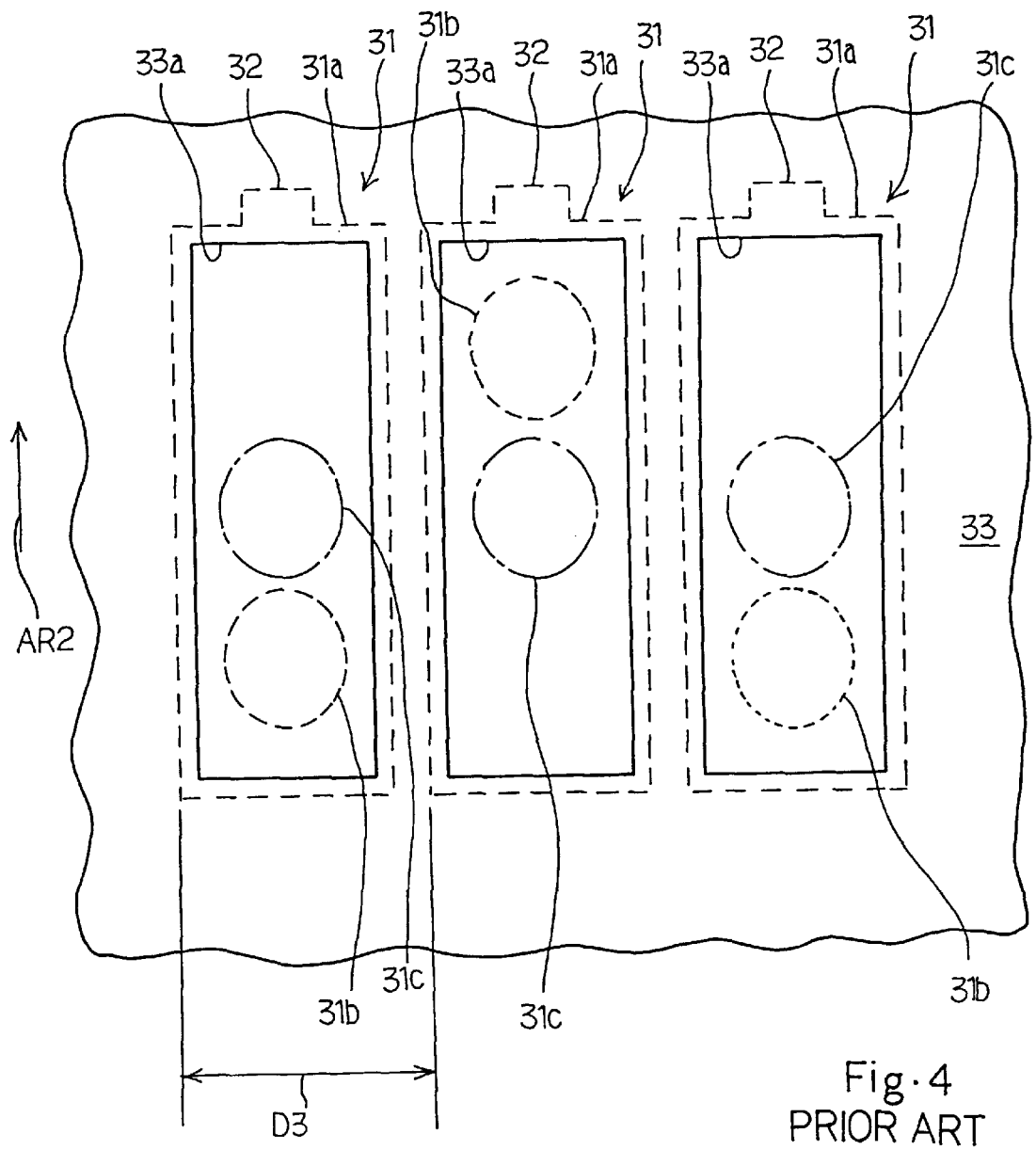
FIG. 4 is a plane view showing the compromise between the prior art pads shown in FIGS. 1 and 3.
Figure 5:
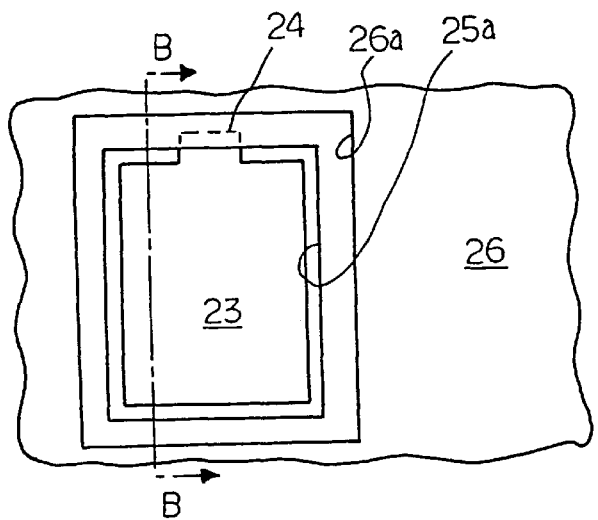
FIG. 5 is a plane view showing the pad incorporated in yet another prior art semiconductor device disclosed in Japanese Patent Publication of Unexamined Application No. 2-166744.
Figure 6:
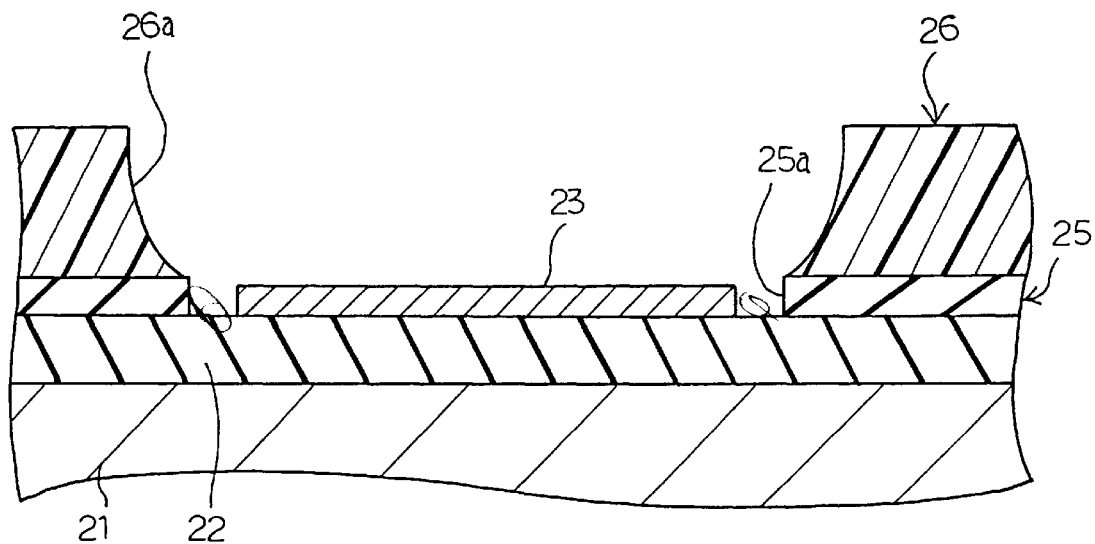
FIG. 6 is a cross sectional view taken along line B—B of FIG. 5 and showing the structure of the prior art semiconductor device.
Figure 7:
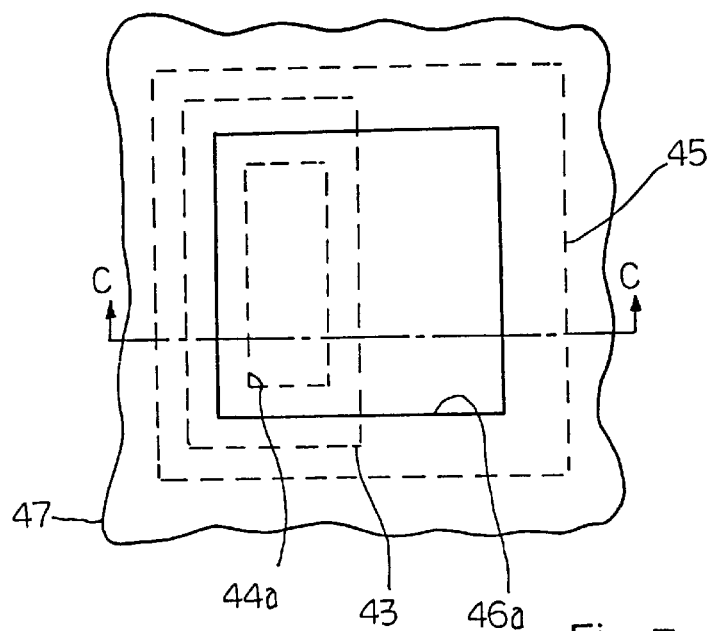
FIG. 7 is a plane view showing the pad incorporated in still another prior art semiconductor device disclosed in Japanese Patent Publication of Unexamined Application No. 6-252201.
Figure 8:
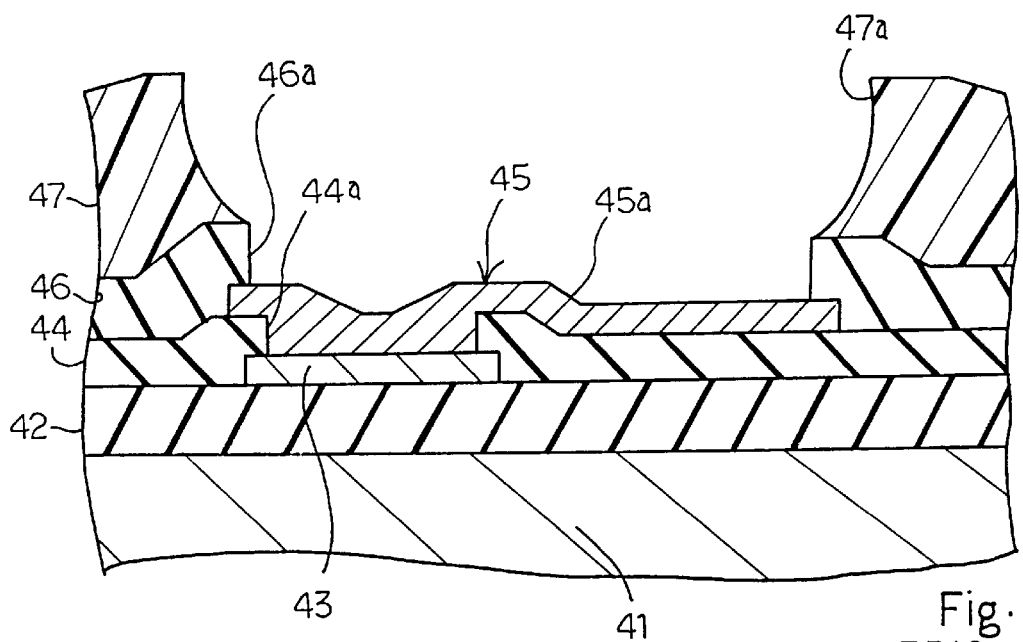
FIG. 8 is a cross sectional view taken along line C—C of FIG. 7 and showing the structure of the prior art semiconductor device.
Figure 9:
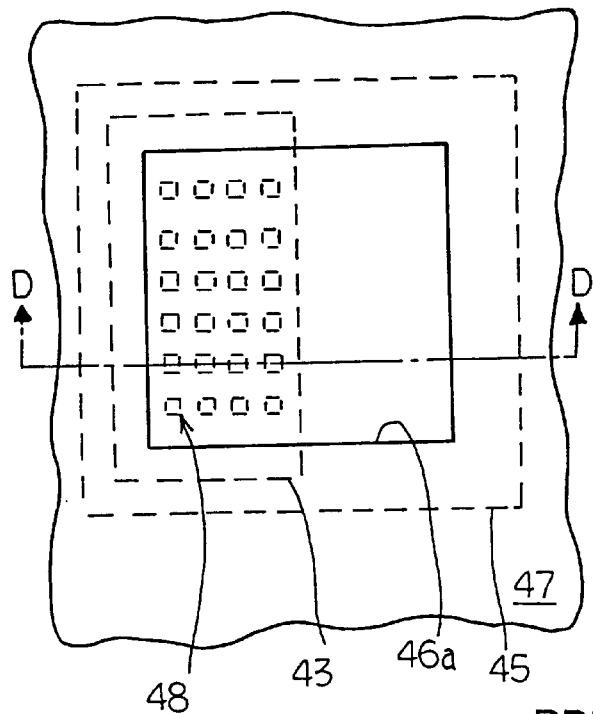
FIG. 9 is a plane view showing the prior art pad formed on the inter-level insulating layer subjected to the chemical mechanical polishing.
Figure 10:
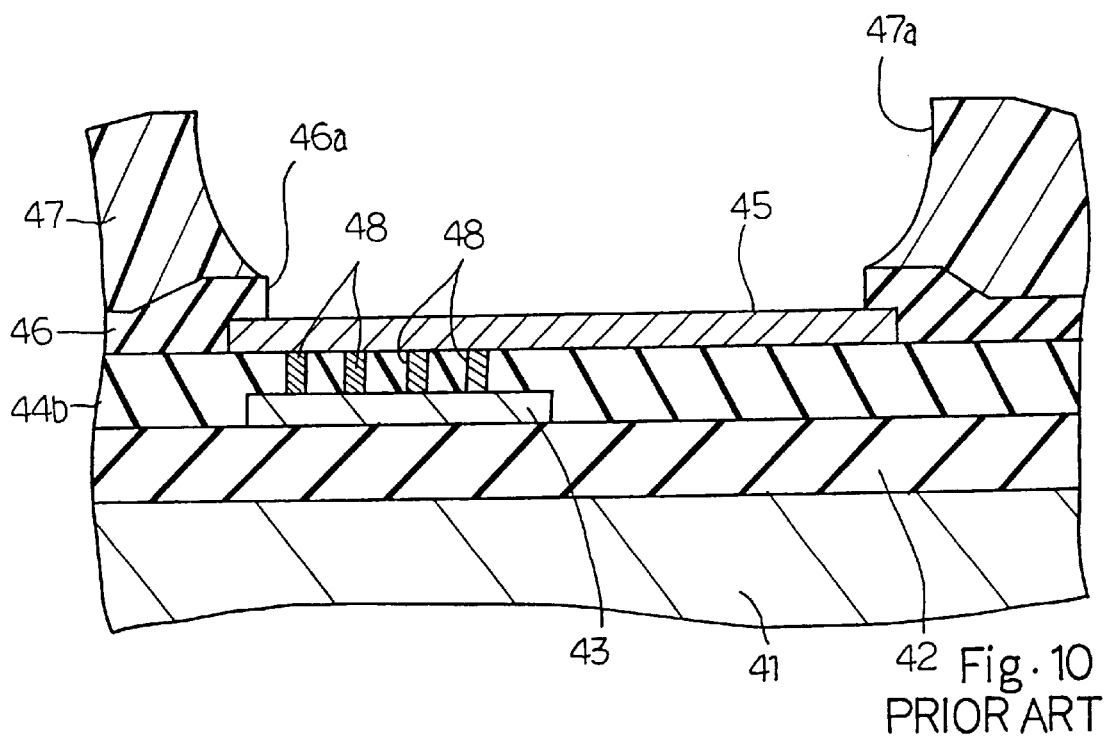
FIG. 10 is a cross sectional view taken along line D—D of FIG. 9 and showing the structure of the prior art pad.
Figure 11A:
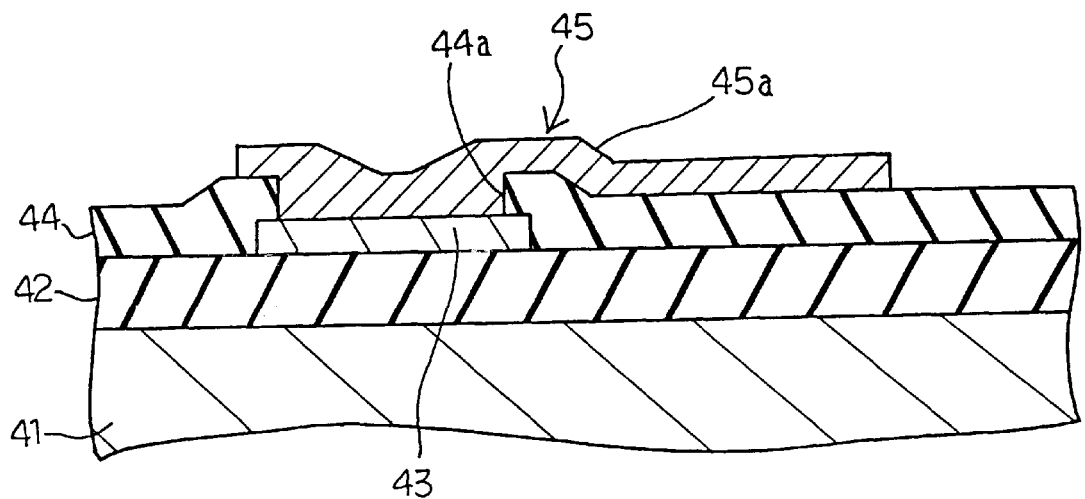
FIGS. 11A and 11B are cross sectional view shoving the prior art process for forming the prior art pad.
Figure 11B:
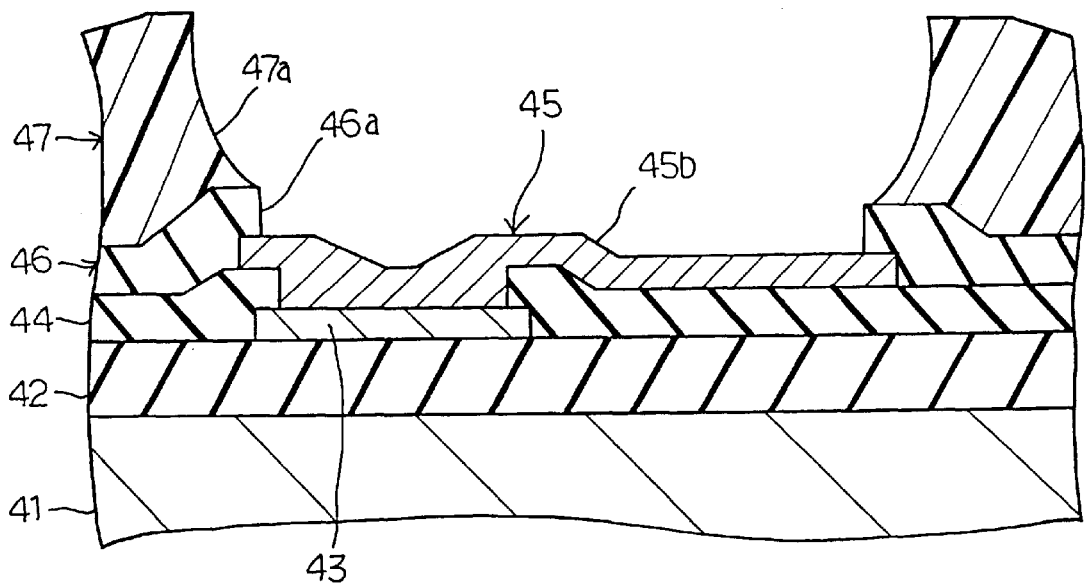
Figure 12:
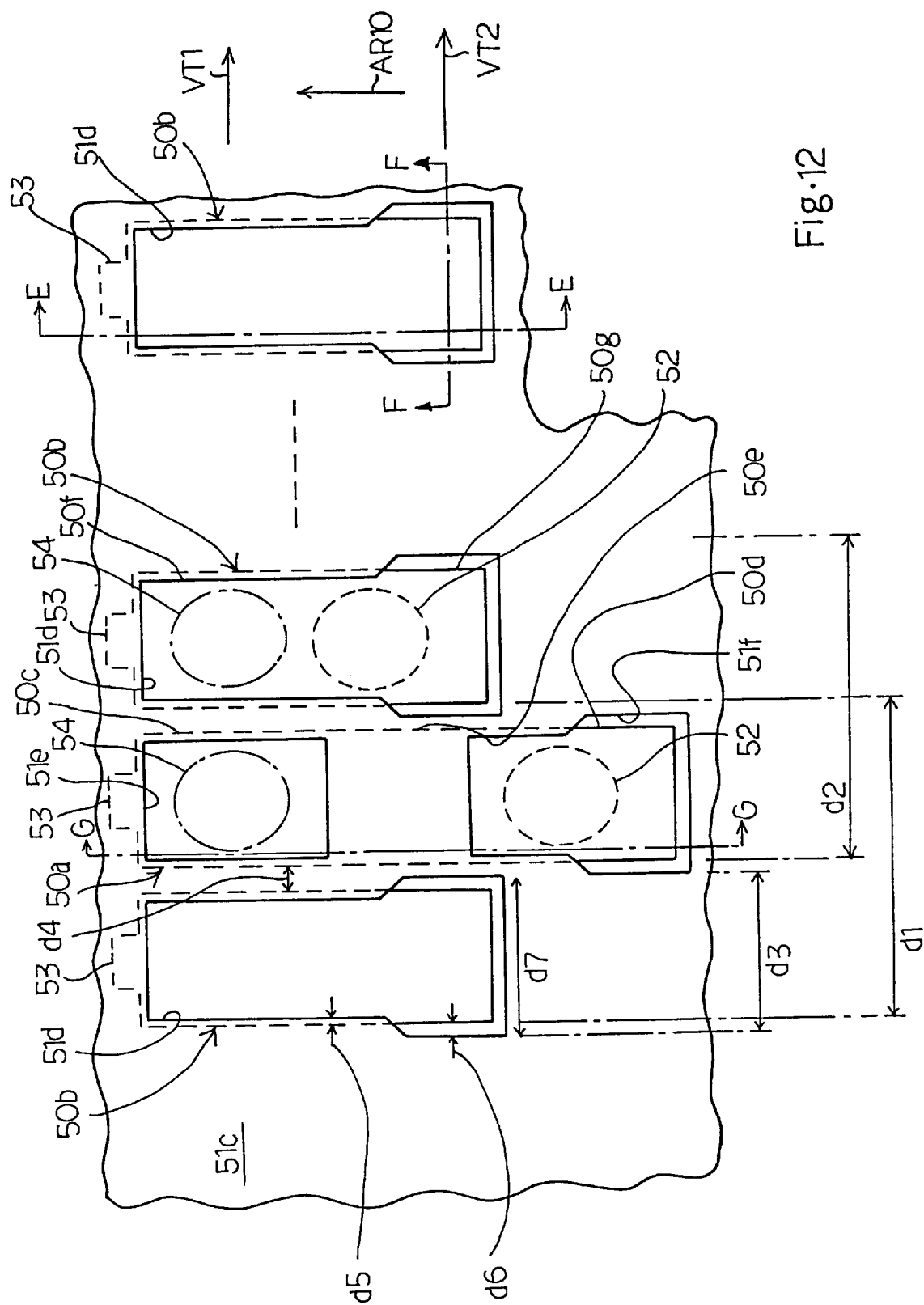
FIG. 12 is a plane view showing the arrangement of pads incorporated in a semiconductor device according to the present invention.
Figure 13:
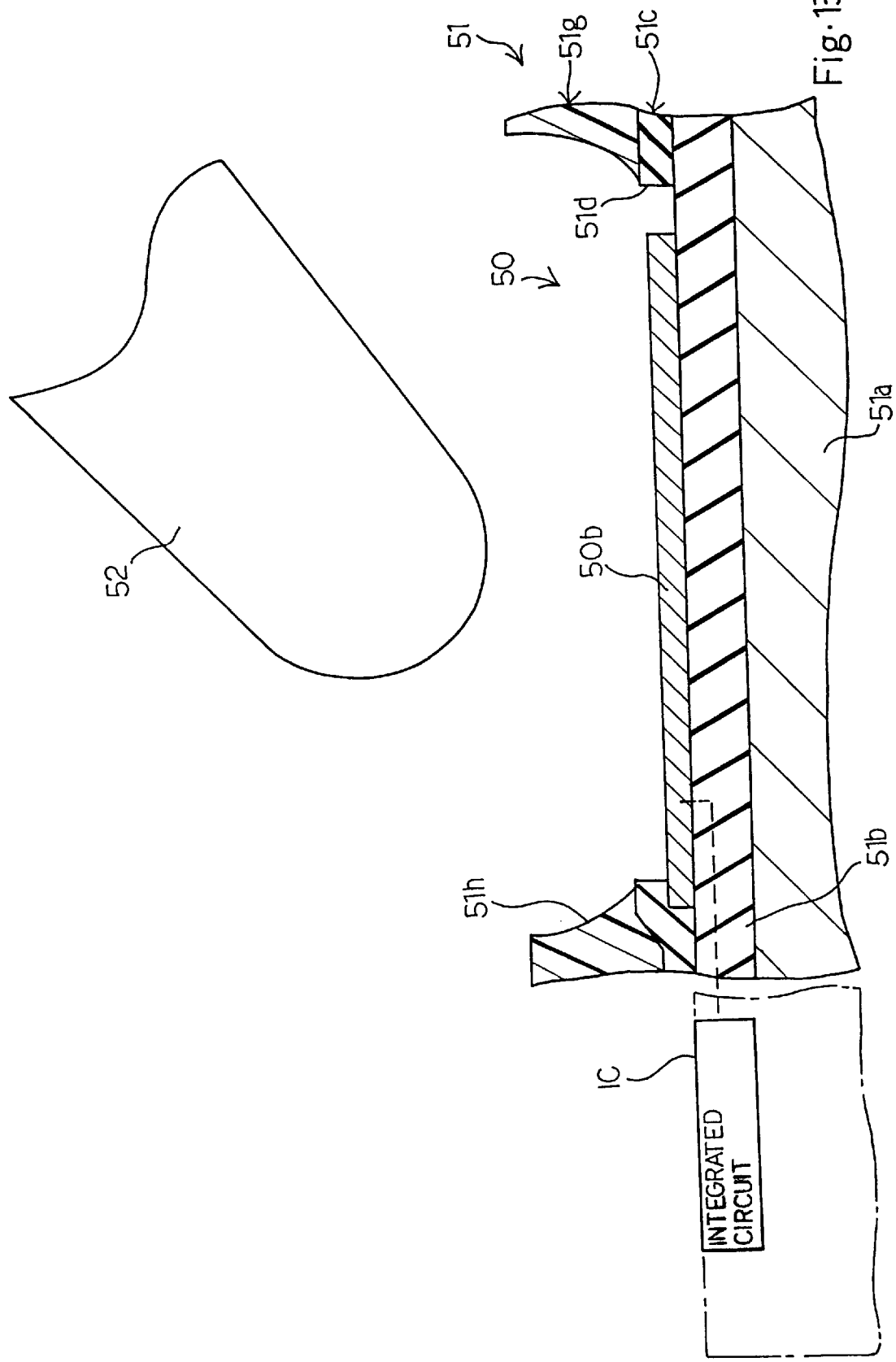
FIG. 13 is a cross sectional view taken along line E—E of FIG. 12 and showing the structure of the semiconductor device.
Figure 14:
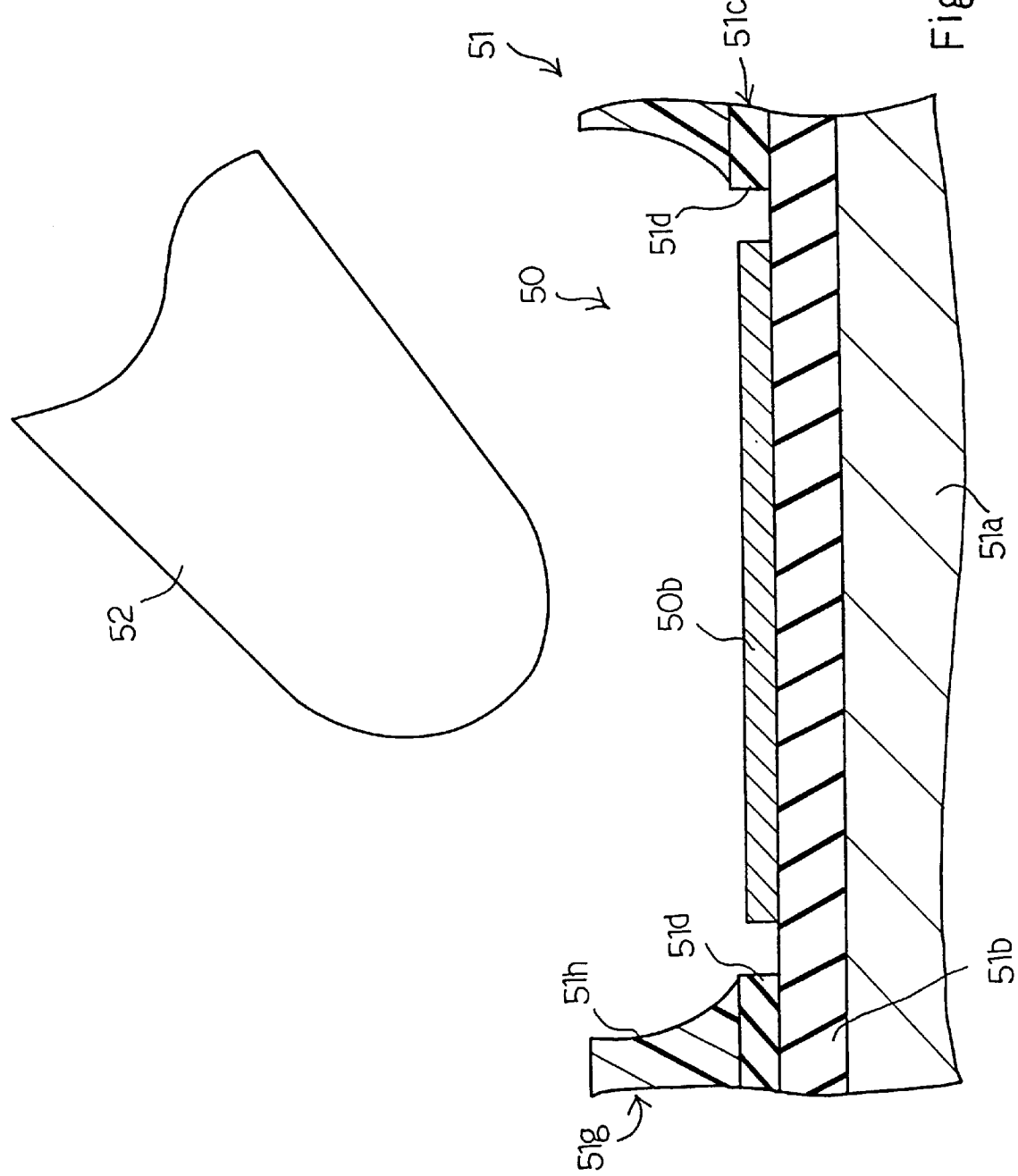
FIG. 14 is a cross sectional view taken along line F—F of FIG. 12 and showing the structure of the semiconductor device.
Figure 15:
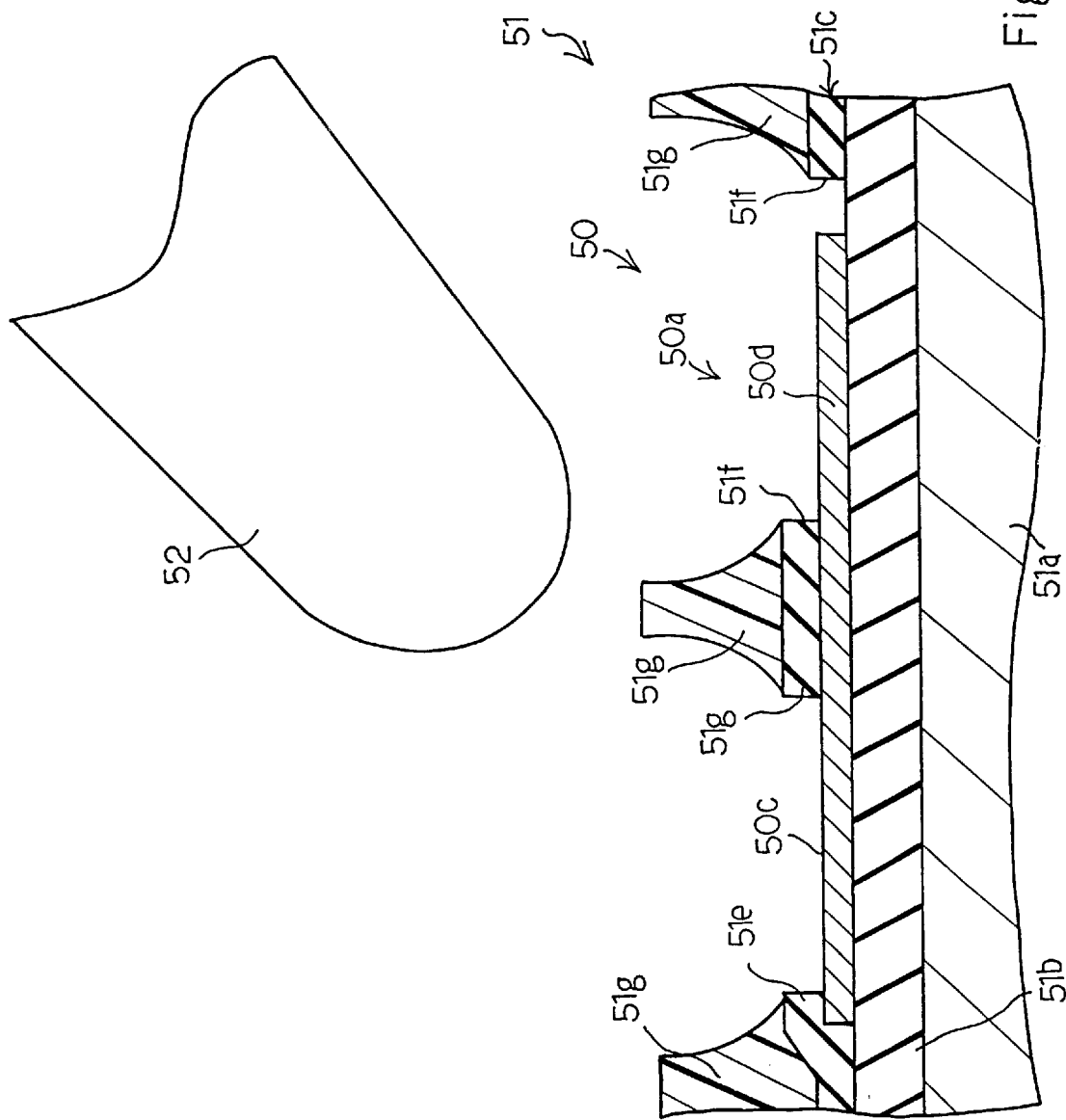
FIG. 15 is a cross sectional view taken along line G—G of FIG. 12 and showing the structure of the semiconductor device.
Figure 16:
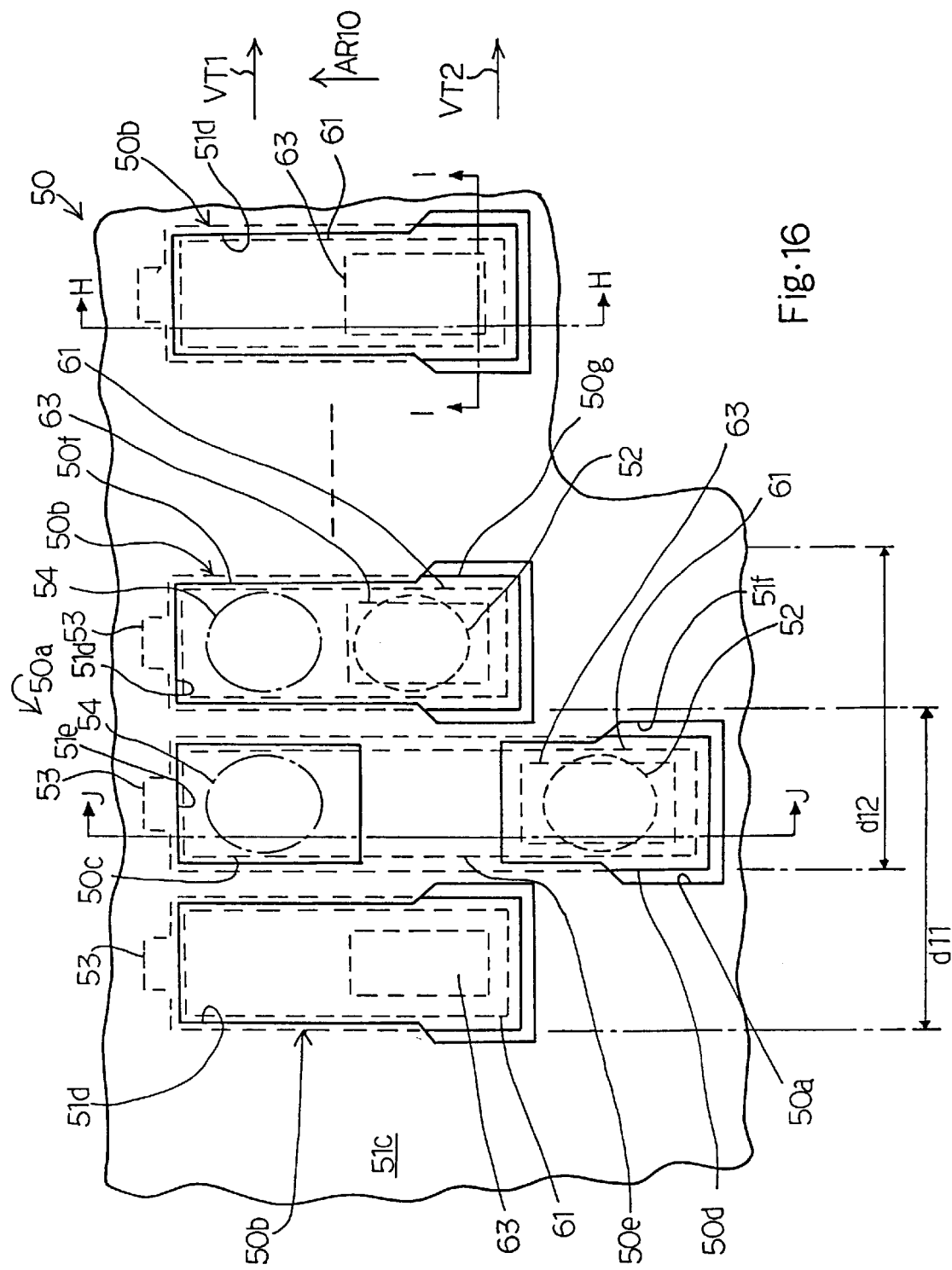
FIG. 16 is a plane view showing the arrangement of pads incorporated in another semiconductor device according to the present invention.
Figure 17:
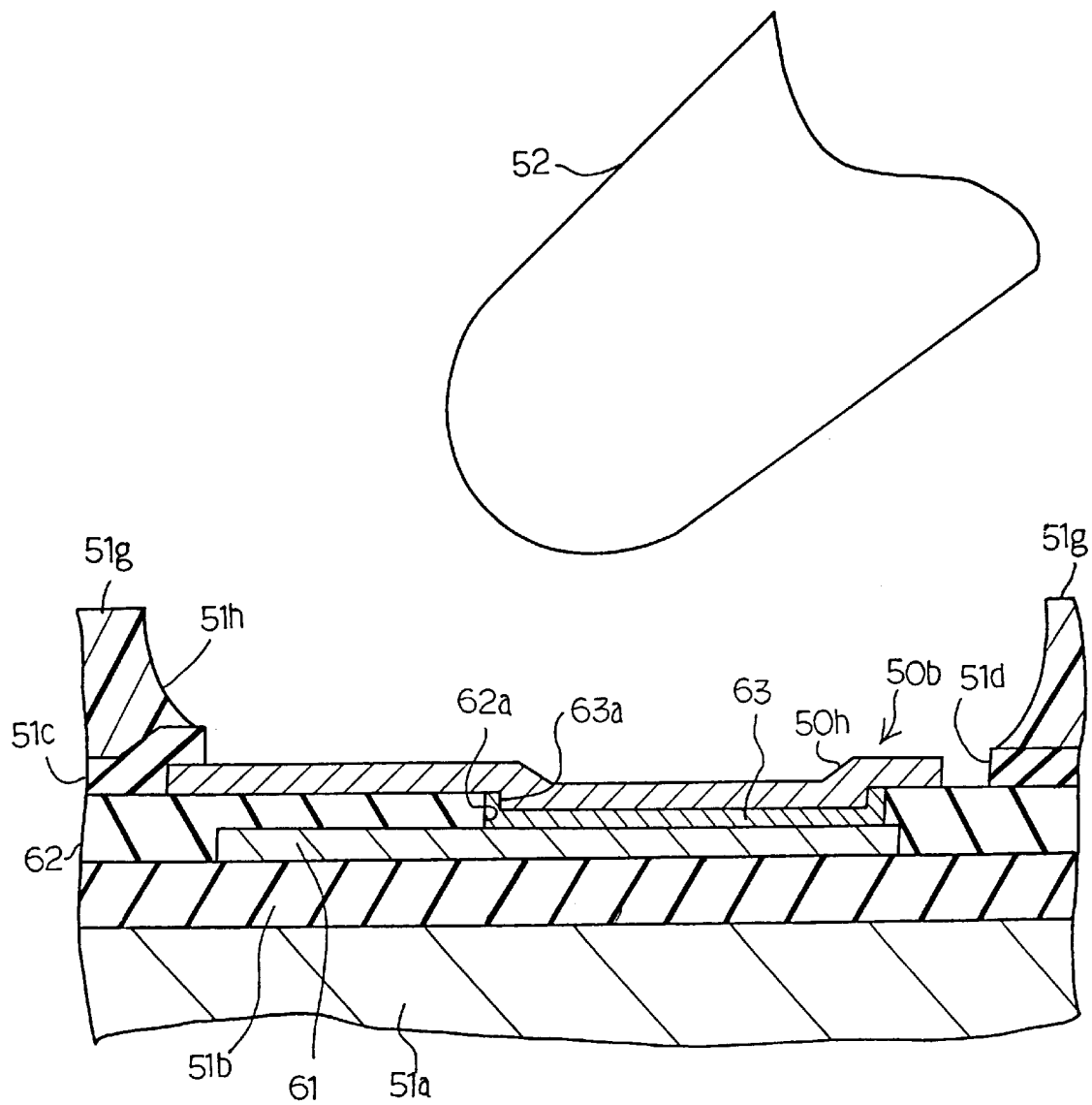
FIG. 17 is a cross sectional view taken along line H—H of FIG. 16 and showing the structure of the semiconductor device.
Figure 18:
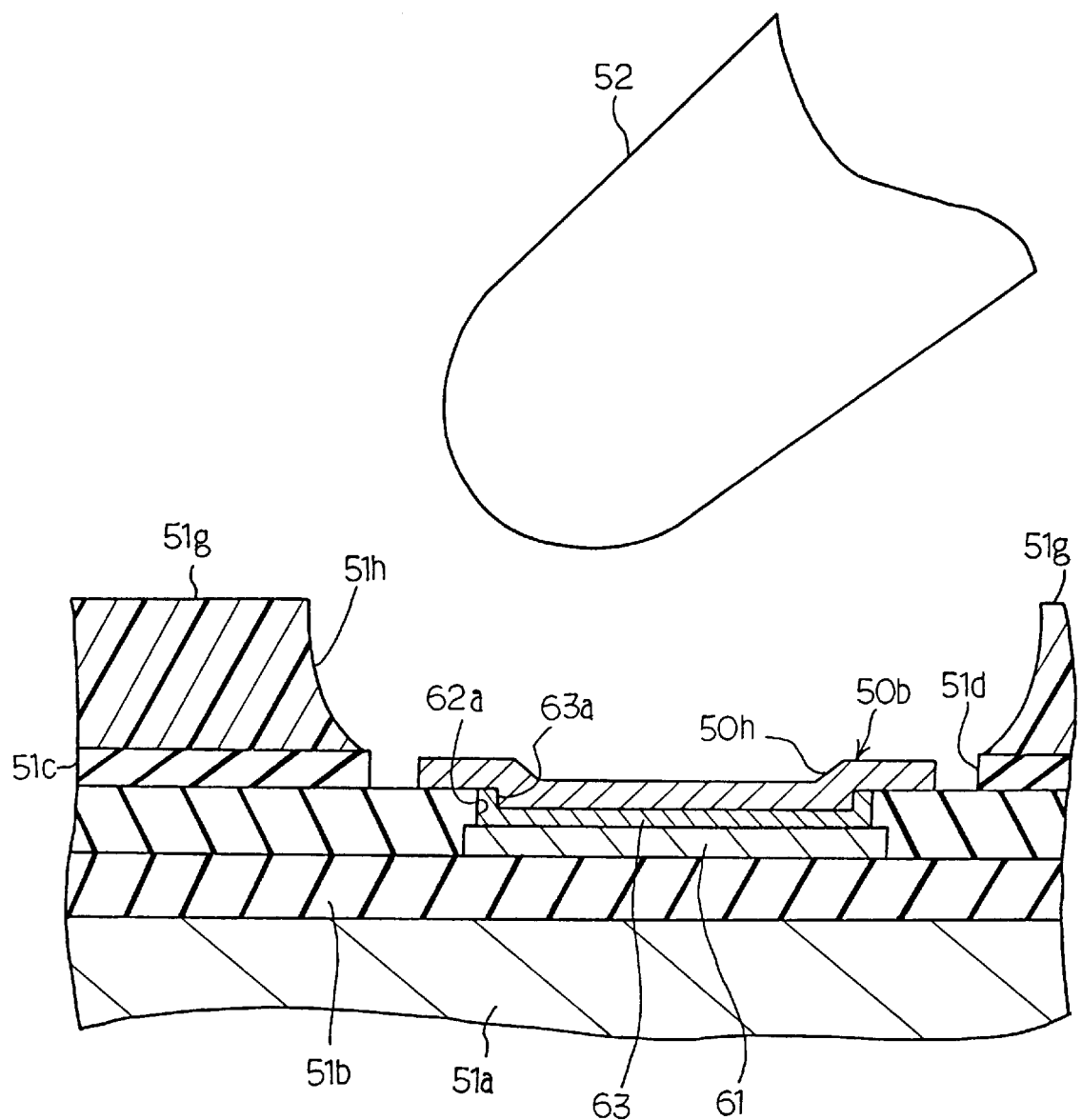
FIG. 18 is a cross sectional view taken along line I—I of FIG. 16 and showing the structure of the semiconductor device.

If the prior art pad arrangement shown in FIG. 4 is arranged at the same pitch as the pads 50a/50b, i.e., 30 microns, the opening 33a is merely 21 microns wide under corresponding conditions, i.e., the distance between the pads 31a and the distance between the periphery of the pad 31a and the periphery of the opening 33a are 3 microns and 3 microns, respectively. Thus, the width of the wide portion is increased at 48 percent with respect to the opening 33a, and allows the tester to surely bring the probes 52 into contact with the pads 50a/50b.

When the semiconductor chip 51 is sealed in a package, the bonding wires/inner leads 54 are bonded to the first/third contact areas. Even if the tape automated bonding technology is used for the package, the inner leads 54 are equal in length, and are exactly patterned by using an etching technique.

In this instance, the passivation layer 51c and the polyimide layer 51g as a whole constitute a protective layer, and the semiconductor substrate 51a and the insulating layer 51b form in combination a substrate structure.

As will be understood from the foregoing description, the long/short pads 50a/50b make the partially widened openings 51d/51f staggered, and the manufacturer can arrange the partially widened openings 51d/51f as close as possible without any interference. Thus, the combination of long/short pads 50a/50b and the partially widened openings 51d/51f allows the manufacturer to arrange the pads 50a/50b at a fine pitch less than 40 microns without sacrifice of the probing.

Second Embodiment

FIGS. 16 to 19 illustrate an array 60 of pads incorporated in another semiconductor integrated circuit device embodying the present invention. The semiconductor integrated circuit device is similar to the first embodiment except for a lower level aluminum layer 61, and, for this reason, the other layers and openings are labeled with the same references designating corresponding layers and openings of the first embodiment without detailed description.

The lower level aluminum layer 61 is formed on the insulating layer 51b, and is partially covered with an insulating layer 62. The insulating layer 62 is subjected to a chemical mechanical polishing, and has a flat upper surface. A contact hole 62a is formed in the insulating layer 62, and a tungsten layer 63 is conformably formed in the contact hole 62a. The tungsten layer 63 defines a recess 63a, and the pad 50a/50b conformably extends over the tungsten layer 63. For this reason, The recess 63a is transferred from the tungsten player 63 to the long/short pad 50a/50b, and a recess 50h is formed in the long/short pad 50a/50b. The recess 50h is formed in the second/fourth contact area, and causes the probe 52 to stop at the second/fourth contact area. Moreover, even if the tester strongly presses the probe 52 against the second/fourth contact area, the probe 52 does not slide, and surely stays in the second/fourth contact area.

The long pads 50a and the short pads 50b are respectively arranged at pitch d11 and pitch d12, respectively, and the pitch d11 and the pitch d12 are 60 microns in this instance. Therefore, the array 50 of pads has a fine pitch of 30 microns.

Figure 20A:
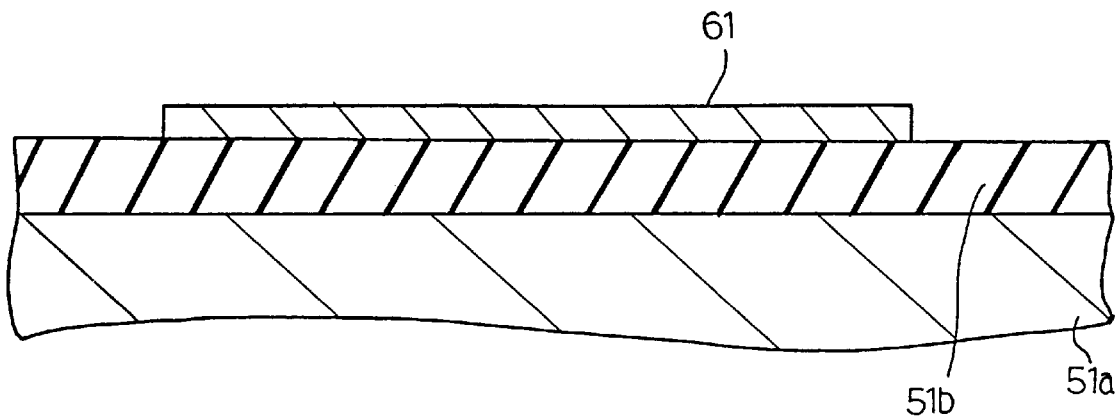
FIGS. 20A to 20C are cross sectional views showing a process for fabricating the semiconductor device shown in FIGS. 16 to 19.

Description is hereinbelow made on a process for fabricating, the semiconductor integrated circuit device with reference to FIGS. 20A to 20C. The process starts with preparation of the semiconductor substrate 51a. The insulating layer 51b is selectively grown on the major surface of the semiconductor substrate 51a, and various circuit components (not shown) are fabricated on the active areas in the major surface. Aluminum is deposited to 0.5 micron thick over the entire surface of the resultant semiconductor structure by using a sputtering technique, and forms an aluminum layer. Photo-resist etching mask (not shown) is formed on the aluminum layer by using photolithographic techniques, and the aluminum layer is selectively etched away so as to form the lower level aluminum layer 61 together with other aluminum signal lines (not shown). The resultant semiconductor structure is shown in FIG. 20A.

Subsequently, insulating material is deposited to 0.5 micron thick over the entire surface of the resultant semiconductor structure, and forms the insulating layer 62. A photo-resist etching mask (not shown) is formed on the insulating layer 62 by using the photo-lithographic techniques, and the insulating layer 62 is selectively etched away so as to form the contact hole 62a together with other contact holes (not shown) for the aluminum signal lines. The other contact holes measure 0.5 micron by 0.5 micron. On the other hand, the contact hole 62a measures 30 microns by 40 microns.

Tungsten is deposited to 0.5 micron thick over the entire surface of the resultant semiconductor structure, and a tungsten layer conformably extends over the insulating layer 62 and the exposed surface of the lower level aluminum layer 61. The contact hole 62a is so wide that the tungsten layer does not fill the contact hole 62a. For this reason, the tungsten layer is depressed by 0.5 micron to 1.0 micron in the contact hole 62a, and the recess 63a is formed in the tungsten layer. When the contact hole 62a is as wide as or wider than the area of 1.0 micron by 1.0 micron, the tungsten layer of 0.5 micron thick is depressed in the contact hole 62a.

Figure 20B:
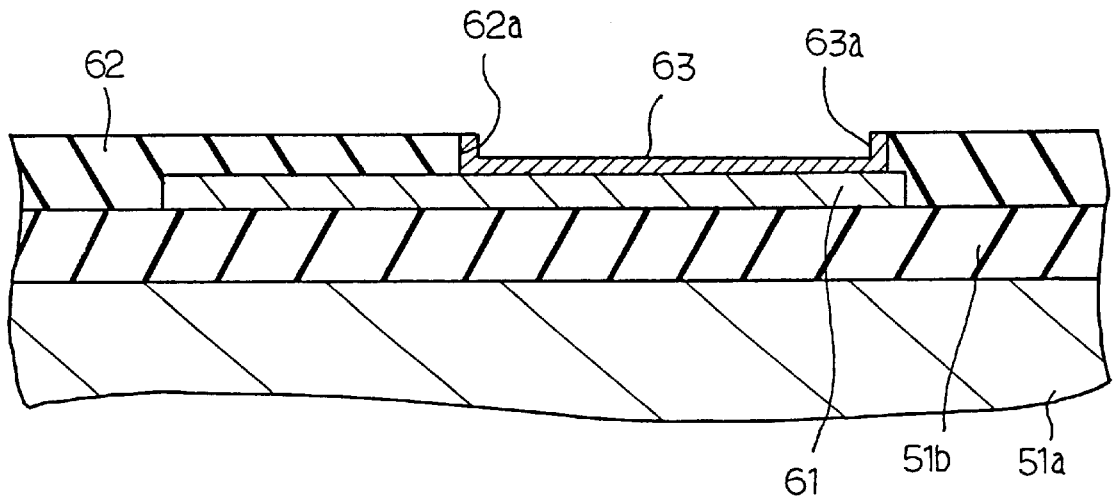
Figure 20C:
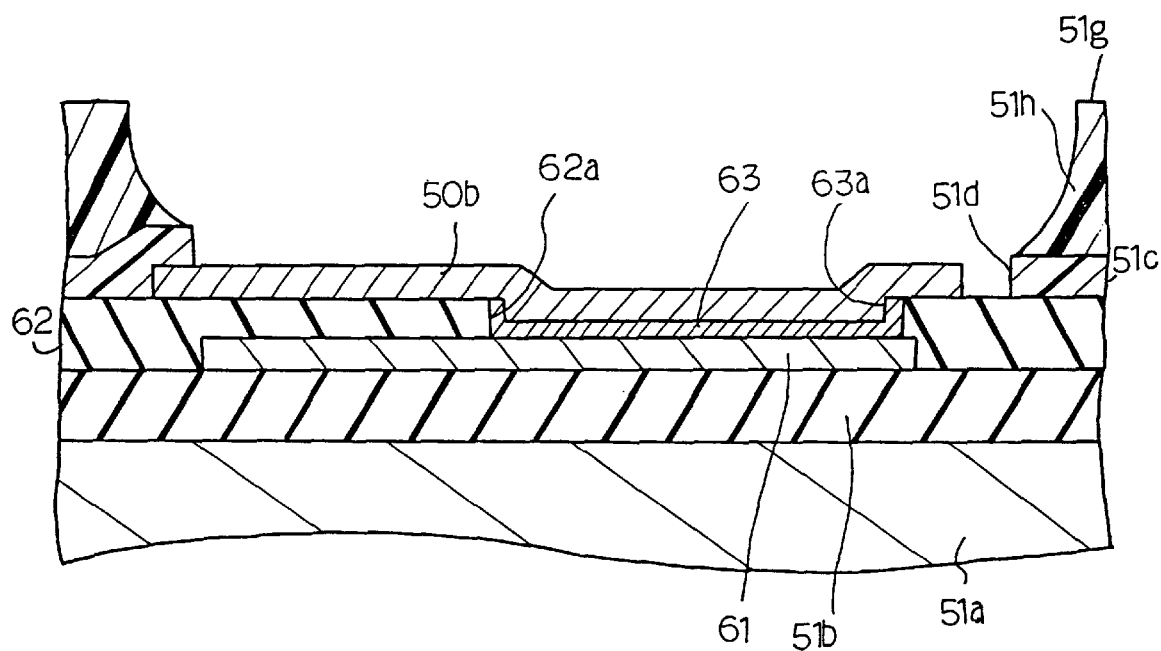

The tungsten layer is chemically mechanically polished until a flat upper surface is created in the insulating layer 62, and the tungsten layer 63 is left in the contact hole 62a as shown in FIG. 20B. Thus, even though tile insulating layer Aluminum is deposited over the entire surface of the resultant semiconductor structure by using the sputtering technique, and forms an aluminum layer of 0.5 micron thick. The recesses 63a are transferred to the aluminum layer. A photo-resist etching mask (not shown) is formed on the aluminum layer, and the aluminum layer is selectively etched away so as to form the long/short pad 50a/50b. The long/short pad 50a/50b is connected through the tungsten layer 63 to the lower level aluminum layer 61.

Insulating material such as, for example, silicon nitride is deposited to 0.3 micron thick over the entire surface of the resultant semiconductor structure, and forms the passivation layer 51c. Polyimide is further deposited to 5 microns thick over the passivation layer, and forms the polyimide layer 51g. A photo-resist etching mask (not shown) is formed on the polyimide layer 51g, and the polyimide layer 51g and the passivation layer 51c are partially etched away so as to form the openings 51h and 51d/51e/51f. An isotropic etching such as a wet etching is used for the polyimide layer 51g, and the openings 51h are defined by the rounded surfaces. The rounded surfaces are desirable for the probing, because the probe 52 does not concentrate force on an extremely narrow area. Moreover, the rounded surfaces guide the probes to the long/short pads 50a/50b.

The second embodiment achieves all the advantages of the first embodiment. Moreover, the recesses 50h cause the probes 52 to stop at the second/fourth contact areas, and the long/short pads 50a/50b with the recesses 50h improve the reliability of the diagnosis carried out through the probes 52 surely held in contact with the long/short pads 50a/50b. Although the prior art process can form recesses in the long/short pads 50a/50b, the above described process is better than the prior art process, because the prior art process can not precisely controls the depth and dimensions of the recesses.

Third Embodiment

Figure 21:
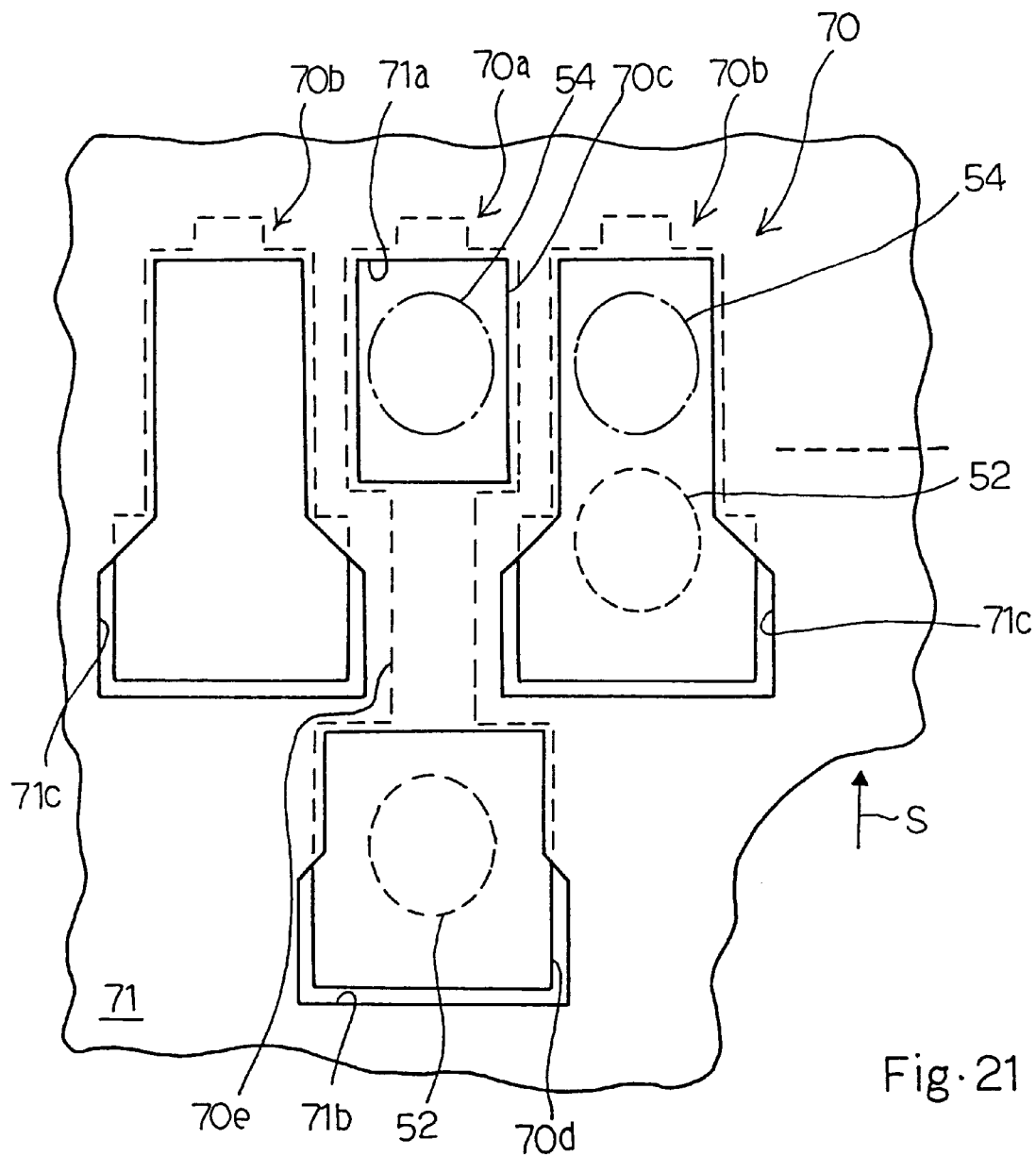
FIG. 21 is a plane view showing the arrangement of pads incorporated in yet another semiconductor device according to the present invention.

FIG. 21 illustrates an array 70 of pads incorporated in yet another semiconductor integrated circuit device embodying the present invention and long/short pads 70a/70b form the array 70. The semiconductor integrated circuit device implementing the third embodiment is similar to the first embodiment except for the configuration of the long/short pads 70a, 70b. The array 70 of pads is covered with a protective layer 71, and the long/short pads 70a/70b are exposed to openings 71a/71b/71c formed in the protective layer 71.

The long pad 70a has a first contact portion 70c, a second contact portion 70d and a connecting portion 70e as similar to the pad 50a. Although the first contact portion 70c is equal in width to the second contact portion 70d, the connecting portion 70e is narrower than the first and second contact portions 70c/70d, and allows the adjacent short pads 70b to increase the width on both sides thereof. For this reason, the manufacturer decreases the pad pitch of the array 70 rather than that of the first embodiment. Otherwise, the manufacturer increases the width of the openings 71b/71c, and the probes 52 are easily brought into contact with the second/fourth contact areas in the testing operation.

As will be appreciated from the foregoing description, the openings are constricted from the wide portions to the narrow portions, and the narrow portion of each opening is opposed to the wide portions of the adjacent openings. As a result, the long/short pads are arranged at the fine pitch less than 40 microns. Moreover, the constricted portions guide the probes to the target contact areas of the long/short pads, and the tester surely brings the probes in contact with the target contact areas in the testing operations. This results in enhancement of reliability of the diagnosis.

Although particular embodiments of the present invention have been shown and described, it will be obvious to those skilled in the art that various changes and modifications may be made without departing from the spirit and scope of the present invention.

The passivation/polyimide layers 51c/51g may be removed from the portion over the connecting portions 50e so as to merge the openings 51e/51f with each other.

The passivation/polyimide layers may be thicker than those of the embodiments in so far as the passivation/polyimide layers guide the probes to the contact areas.

What is claimed is:

1. A semiconductor device comprising:

a substrate structure having an insulating layer, a plurality of first pads formed on said insulating layer and electrically connected to an integrated circuit;

a plurality of second pads longer than said plurality of first pads, electrically connected to said integrated circuit and alternated with said plurality of first pads on said insulating layer along a first virtual line;

a protective layer covering said insulating layer, said plurality of first pads and said plurality of second pads, and formed with a plurality of first openings respectively associated with said plurality of first pads, said first openings having first narrow portions at an end of said first pads intersecting said first virtual line and first wide portions at another end of said first pads, wherein the width of said first wide portions is greater than the width of said first pads, and a plurality of second openings respectively associated with said plurality of second pads, said plurality of second openings having second narrow portions at an end of said second pads intersecting said first virtual line and second wide portions at another end of said second pads, wherein the width of said second wide portions is greater than the width of said second pads, and said second wide portions being offset from said first wide portions in longitudinal directions of said plurality of second pads perpendicular to said first virtual line.

2. The semiconductor device as set forth in claim 1, in which said plurality of first pads have respective first contact areas along said first virtual line connected to first conductive members of a package and respective second contact areas substantially at a transition between said first wide portions and said first narrow portions held in contact with first probes of a tester slidable thereon in a first direction in parallel to said longitudinal directions during a diagnosis for said integrated circuit in said plurality of first openings, respectively, and said plurality of second pads have respective third contact areas along said first virtual line connected to second conductive members of said package and respective fourth contact areas substantially at a transition between said second wide portions and said second narrow portions held in contact with second probes of said tester sliadable thereon in said first direction during said diagnosis in said plurality of second openings.

3. The semiconductor device as set forth in claim 2, in which said first contact areas and said third contact areas are arranged on said first virtual line extending in a second direction perpendicular to said first direction, and said second contact areas and said fourth contact areas are arranged on both sides of a second virtual line extending in parallel to said first virtual line in a staggered manner.

4. The semiconductor device as set forth in claim 2, in which said plurality of second pads further have respective connecting areas between said third contact areas and said fourth contact areas so that said first wide portions are mainly opposed to said connecting portions of the adjacent second pads.

5. The semiconductor device as set forth in claim 4, in which each of said plurality of second openings has a first sub-opening exposing said third contact area of the associated second pad and a second sub-opening exposing said fourth contact area of said associated second pad and spaced from said first sub-opening by part of said protective layer, and associated one of said second probes stops the sliding motion at said part of said protective layer.

6. The semiconductor device as set forth in claim 5, in which said plurality of first pads and said plurality of second pads are constant in width along said first direction, a peripheral line of each first pad is partially covered with said protective layer defining said first narrow portion of the associated one of said plurality of first openings and partially exposed to said first wide portion of said associated one of said plurality of first openings, and a peripheral line of each second pad is partially covered with said protective layer defining said first sub-opening and partially exposed to said second sub-opening of associated one of said plurality of second openings.

7. The semiconductor device as set forth in claim 2, in which first recesses are respectively formed in said plurality of first pads so as to locate essential parts of said second contact areas in said first recesses, respectively, and second recesses are respectively formed in said plurality of second pads so as to locate essential parts of said fourth contact areas in said second recesses, respectively.

8. The semiconductor device as set forth in claim 7, in which said first contact areas and said third contact areas are arranged on said first vertical line extending in a second direction perpendicular to said first direction, and said second contact areas and said fourth contact areas are arranged on both sides of a second virtual line extending in parallel to said first virtual line in a staggered manner.

9. The semiconductor device as set forth in claim 7, in which said plurality of second pads further have respective connecting areas between said third contact areas and said fourth contact areas so that said first wide portions are mainly opposed to said connecting portion of the adjacent second pad.

10. The semiconductor device as set forth in claim 9, in which each of said plurality of second openings has a first sub-opening exposing said third contact area of the associated second pad and a second sub-opening exposing said fourth contact area of said associated second pad and spaced from said first sub-opening by part of said protective layer, and associated one of said second probes stops the sliding motion at said part of said protective layer.

11. The semiconductor device as set forth in claim 10, in which said plurality of first pads and said plurality of second pads are constant in width along said first direction, a peripheral line of each first pad is partially covered with said protective layer defining said narrow portion of the associated one of said plurality of first openings and partially exposed to said wide portion of said associated one of said plurality of first openings, and a peripheral line of each second pad is partially covered with said protective layer defining said first sub-opening and partially exposed to said second wide portion of associated one of said plurality of second openings.

12. The semiconductor device as set forth in claim 1, in which said plurality of first pads have respective first narrow portions partially exposed to said first narrow portions of the associated first openings and first wide portions respectively contiguous to said first narrow portions and partially exposed to said first wide portions of said associated first openings, and said plurality of second pads have respective second wide portions partially exposed to said second narrow portions of the associated second openings, third wide portions respectively connected to said second wide portions by means of respective connecting portions narrower than said second and third wide portions and partially exposed to said second wide portions of said associated second openings.

13. The semiconductor device as set forth in claim 12, in which said first wide portions of said plurality of first pads are opposed to said connecting portions of the adjacent second pads.

14. The semiconductor device as set forth in claim 13, in which each of said plurality of second openings has a first sub-opening exposing said second wide portion of the associated second pad and a second sub-opening constricted, exposing a part of said third wide portion and spaced from said first sub-opening by part of said protective layer.

15. The semiconductor device as set forth in claim 14, in which said plurality of first pads provide respective first contact areas on said first narrow portions for first conductive members of a package and respective second contact areas on both sides of boundaries between said first narrow portions and said first wide portions for first probes of a tester slidable in a first direction in parallel said longitudinal directions, and said plurality of second pads provide respective third contact areas on said second wide portions for second conductive members of said package and respective fourth contact areas on said third wide portions for second probes of said tester slidable in said first direction.

16. The semiconductor device as set forth in claim 15, in which said first contact areas and said third contact areas are arranged along said first virtual line extending in a second direction perpendicular to said first direction, and said second contact areas and said fourth contact areas are arranged oil both sides of a second virtual line parallel to said first virtual line in a staggered manner.

* * * * *